(12) United States Patent
Lee et al.

(10) Patent No.: US 10,559,424 B2
(45) Date of Patent: Feb. 11, 2020

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Jong Pil Lee, Suwon-si (KR); Hyo Youn Lee, Suwon-si (KR); Sung Kwon An, Suwon-si (KR); Seung Woo Song, Suwon-si (KR); Taek Jung Lee, Suwon-si (KR); Jin Kyung Joo, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/004,830

(22) Filed: Jun. 11, 2018

(65) Prior Publication Data

US 2019/0074137 A1    Mar. 7, 2019

(30) Foreign Application Priority Data

Sep. 6, 2017    (KR) .................. 10-2017-0113802

(51) Int. Cl.
*H01G 4/012*  (2006.01)
*H01G 4/232*  (2006.01)
(Continued)

(52) U.S. Cl.
CPC .............. *H01G 4/232* (2013.01); *H01G 2/06* (2013.01); *H01G 4/012* (2013.01); *H01G 4/248* (2013.01);
(Continued)

(58) Field of Classification Search
CPC .......... H01G 2/06; H01G 4/005; H01G 4/012; H01G 4/232; H01G 4/248; H01G 4/30;
(Continued)

(56) References Cited

U.S. PATENT DOCUMENTS

| 7,414,857 | B2 | 8/2008 | Ritter et al. |
| 7,697,262 | B2 | 4/2010 | Ritter et al. |

(Continued)

FOREIGN PATENT DOCUMENTS

| JP | 2007-189260 A | 7/2007 |
| KR | 10-2006-0098771 | 9/2006 |

(Continued)

OTHER PUBLICATIONS

Notice of Office Action issued in Korean Patent Application No. 10-2017-0113802, dated Sep. 12, 2018 (English translation).

(Continued)

*Primary Examiner* — Timothy J Thompson
*Assistant Examiner* — Guillermo J Egoavil
(74) *Attorney, Agent, or Firm* — Morgan, Lewis & Bockius LLP (57) ABSTRACT

A multilayer capacitor and a board having the same provide high capacitance and low equivalent series inductance (ESL). The multilayer capacitor includes a capacitor body including an active region, including first and second internal electrodes, and first and second cover regions. Third and fourth internal electrodes are alternately disposed in the cover region adjacent to a mounting surface. First and second external electrodes respectively contact the first and second internal electrodes to provide capacitance. First and second via electrodes are disposed in the cover region, where the first via electrode connects the third internal electrode and a first band portion of the first external electrode to each other, and where the second via electrode (Continued)

connects the fourth internal electrode and a second band portion of the second external electrode to each other.

17 Claims, 5 Drawing Sheets

(51) Int. Cl.
- *H01G 4/248* (2006.01)
- *H01G 4/30* (2006.01)
- *H05K 1/18* (2006.01)
- *H01G 2/06* (2006.01)
- *H01G 4/12* (2006.01)
- *H05K 1/11* (2006.01)

(52) U.S. Cl.
CPC .............. *H01G 4/30* (2013.01); *H05K 1/181* (2013.01); *H01G 4/1227* (2013.01); *H05K 1/111* (2013.01); *H05K 2201/10015* (2013.01); *H05K 2201/10636* (2013.01)

(58) Field of Classification Search
CPC ........ H01G 4/1227; H05K 1/18; H05K 1/181; H05K 1/185; H05K 1/111; H05K 2201/10015; H05K 2201/10636; Y02P 70/611
USPC ........................................ 174/260; 361/301.4
See application file for complete search history.

(56) References Cited

U.S. PATENT DOCUMENTS

| | | |
|---|---|---|
| 2006/0198079 A1 | 9/2006 | Shim et al. |
| 2007/0041146 A1 | 2/2007 | Togashi |
| 2009/0059469 A1 | 3/2009 | Lee et al. |
| 2012/0018204 A1* | 1/2012 | Sato ...................... H01G 4/232 174/260 |
| 2014/0104750 A1 | 4/2014 | Ann et al. |
| 2015/0021080 A1* | 1/2015 | Lee ........................ H01G 4/005 174/260 |
| 2016/0211074 A1 | 7/2016 | Gu et al. |
| 2017/0213647 A1* | 7/2017 | Ahn .................... H05K 3/3442 |

FOREIGN PATENT DOCUMENTS

| | | |
|---|---|---|
| KR | 10-1376839 B1 | 3/2014 |
| KR | 10-2015-0011269 A | 1/2015 |
| KR | 10-2016-0089819 A | 7/2016 |
| KR | 10-2017-0087665 A | 7/2017 |

OTHER PUBLICATIONS

Non-Final Office Action issued in related U.S. Appl. No. 16/270,745 dated Jul. 31, 2019.

* cited by examiner

MULTILAYER CAPACITOR AND BOARD HAVING THE SAME

CROSS-REFERENCE TO RELATED APPLICATION(S)

This application claims benefit of priority to Korean Patent Application No. 10-2017-0113802 filed on Sep. 6, 2017 in the Korean Intellectual Property Office, the disclosure of which is incorporated herein by reference in its entirety.

BACKGROUND

1. Field

The present disclosure relates to a multilayer capacitor and a board having the same.

2. Description of Related Art

A multilayer capacitor is a type of multilayer chip electronic component that is commonly mounted on boards of various types of electronic products such as image devices, for example liquid crystal displays (LCD), plasma display panels (PDP), or the like, a computer, a personal digital assistant (PDA), a cellular phone, and the like, to serve to charge or discharge electricity therein or therefrom.

The multilayer capacitor may be used as a component in various types of electronic apparatuses since it has a small size, implements high capacitance, may be easily mounted, and may have various sizes and stacking forms, depending on a use purpose and desired capacitance value.

Recently, the miniaturization, lightening, and multifunctionalization of electronic products have been demanded. In accordance with these trends and with microminiaturization, demand has increased for devices providing a significant increase in capacitance of multilayer capacitors used in electronic products.

Multilayer capacitors having high capacitance have been manufactured by reducing thicknesses of dielectric layers and internal electrodes to be as small as possible for the purpose of microminiaturization, and by stacking of as many dielectric layers as possible to realize a significant increase in capacitance.

However, when the thickness of the dielectric layer is decreased and the boosting is performed, strength of an electric field applied to the dielectric layer is increased due to the boosting, such that direct current (DC) bias characteristics and reliability of the multilayer capacitor may be deteriorated.

In addition, a defect in a fine structure of the internal electrode may occur due to thinness, which may cause deterioration of high temperature withstand voltage characteristics such as a breakdown voltage (BDV), a high temperature insulation resistance (IR), and the like, of the multilayer capacitor.

In order to prevent such a problem, a method of grain-refining base material powder particles of the internal electrode may be considered. However, when a size of the base material powder is decreased, it may be difficult to implement capacitance and temperature characteristics desired by a user, and a dielectric constant may be decreased.

In addition, electronic devices such as mobile devices or modules, and the like, have been required to have low equivalent series inductance (ESL) characteristics in order to control noise when processing high speed data, together with miniaturization and multifunctionalization.

SUMMARY

An aspect of the present disclosure may provide a multilayer capacitor providing a miniaturized structure, high capacitance, and a low equivalent series inductance (ESL). A board having the multilayer capacitor mounted thereon is also disclosed.

According to an aspect of the present disclosure, a multilayer capacitor may include a capacitor body having first and second surfaces opposing each other and third and fourth surfaces connected to the first and second surfaces and opposing each other, and including an active region including dielectric layers and pluralities of first and second internal electrodes alternately disposed with respective dielectric layers interposed therebetween and first and second cover regions disposed on opposite surfaces of the active region, the first and second internal electrodes being exposed through the third and fourth surfaces, respectively. Third and fourth internal electrodes are alternately disposed in the first cover region adjacent to the first surface with respective dielectric layers interposed therebetween. First and second external electrodes include first and second connected portions respectively formed on the third and fourth surfaces of the capacitor body and respectively connected to the first and second internal electrodes, and first and second band portions respectively extending from the first and second connected portions to portions of the first surface. A first via electrode penetrates through the first cover region to connect the third internal electrode and the first band portion to each other, and a second via electrode penetrates through the first cover region to connect the fourth internal electrode and the second band portion to each other. The first surface is a mounting surface.

The multilayer capacitor may include pluralities of third and fourth internal electrodes including third and fourth internal electrodes alternately disposed in the second cover region adjacent to the second surface with respective dielectric layers interposed therebetween. The first and second band portions may further extend from the first and second connected portions to portions of the second surface of the capacitor body. The multilayer capacitor may further include pluralities of first and second via electrodes including first and second via electrodes disposed in the second cover region.

The third and fourth internal electrodes may be disposed to be spaced apart from all edges of the capacitor body.

The dielectric layer of the first cover region may have first and second via through-holes formed therein with the first and second via electrodes penetrating therethrough. The third internal electrode may include a first via hole formed to have a size corresponding to that of the first via through-hole in a position corresponding to that of the first via through-hole and a first via spacing hole formed to have a size greater than that of the second via through-hole in a position corresponding to that of the second via through-hole. The fourth internal electrode may include a second via hole formed to have a size corresponding to that of the second via through-hole in a position corresponding to that of the second via through-hole and a second via spacing hole formed to have a size greater than that of the first via through-hole in a position corresponding to that of the first via through-hole.

The third and fourth internal electrodes may have thicknesses smaller than thicknesses of the first and second internal electrodes.

Each of the dielectric layers disposed in the first and second cover regions may have a thickness equal to or greater than that of each of the dielectric layers disposed in the active region.

The first and second band portions may each include a first body portion extending from a respective one of the first and second connected portions and a second body portion further extending from the first body portion and having margins formed at both sides thereof to have a width smaller than a width of the first body portion, and the first and second via electrodes may be connected to the second body portions of the first and second band portions, respectively.

According to another aspect of the present disclosure, a board having a multilayer capacitor may include a circuit board having first and second electrode pads disposed thereon to be spaced apart from each other, and the multilayer capacitor as described above mounted on the circuit board so that the first and second band portions are connected to the first and second electrode pads, respectively.

According to another aspect of the present disclosure, a multilayer capacitor may include a capacitor body having first and second surfaces opposing each other and third and fourth surfaces connected to the first and second surfaces and opposing each other, and including an active region including dielectric layers and pluralities of first and second internal electrodes alternately disposed with respective dielectric layers interposed therebetween and first and second cover regions disposed on opposite surfaces of the active region, the first and second internal electrodes being exposed through the third and fourth surfaces, respectively. Third and fourth internal electrodes are alternately disposed in the first cover region adjacent to the first surface with respective dielectric layers interposed therebetween. First and second external electrodes include first and second connected portions respectively formed on the third and fourth surfaces of the capacitor body and respectively connected to the first and second internal electrodes and first and second band portions respectively extending from the first and second connected portions to portions of the first surface of the capacitor body. A third external electrode is disposed on the first surface of the capacitor body to be spaced apart from the first band portion. A fourth external electrode is disposed on the first surface of the capacitor body to be spaced apart from the second band portion. A first via electrode penetrates through the first cover region to connect the third internal electrode and the third external electrode to each other. A second via electrode penetrates through the first cover region to connect the fourth internal electrode and the fourth external electrode to each other. The first surface is a mounting surface.

The multilayer capacitor may include pluralities of third and fourth internal electrodes including third and fourth internal electrodes alternately disposed in the second cover region adjacent to the second surface with respective dielectric layers interposed therebetween. The first and second band portions may further extend from the first and second connected portions to portions of the second surface of the capacitor body. The multilayer capacitor may include pluralities of third and fourth external electrodes including third and fourth external electrodes disposed on the second surface of the capacitor body to be spaced apart from the first and second band portions, respectively. The multilayer capacitor may include pluralities of first and second via electrodes including first and second via electrodes disposed in the second cover region.

The third and fourth internal electrodes may be disposed to be spaced apart from all edges of the capacitor body.

The dielectric layer of the first cover region may have first and second via through-holes formed therein with the first and second via electrodes penetrating therethrough. The third internal electrode may include a first via hole formed to have a size corresponding to that of the first via through-hole in a position corresponding to that of the first via through-hole, and the fourth internal electrode may include a second via hole formed to have a size corresponding to that of the second via through-hole in a position corresponding to that of the second via through-hole.

The third internal electrode may include a first via spacing hole formed to have a size greater than that of the second via through-hole in a position corresponding to that of the second via through-hole, and the fourth internal electrode may include a second via spacing hole formed to have a size greater than that of the first via through-hole in a position corresponding to that of the first via through-hole.

Each of the dielectric layers disposed in the first and second cover regions may have a thickness equal to or greater than a thickness of each of the dielectric layers disposed in the active region.

The multilayer capacitor may include pluralities of first and second via electrodes including the first and second via electrodes.

The multilayer capacitor includes pluralities of third and fourth external electrodes each corresponding to and connected to a respective one of the pluralities of first and second via electrodes.

According to another aspect of the present disclosure, a board having a multilayer capacitor may include a circuit board having first and second electrode pads disposed thereon to be spaced apart from each other, and the multilayer capacitor as described above mounted on the circuit board so that the first band portion and the third external electrode are connected to the first electrode pad and the second band portion and the fourth external electrode are connected to the second electrode pad.

According to a further aspect of the disclosure, a multilayer capacitor may include a body comprising pluralities of dielectric layers and internal electrodes alternately disposed therein, and first and second external electrodes disposed on respective opposing third and fourth end surfaces of the body and each extending to first and second surfaces of the body. The plurality of internal electrodes includes first and second internal electrodes alternately disposed to overlap each other in the body and respectively extending to the third and fourth end surfaces of the body. The plurality of internal electrodes further includes pluralities of third and fourth internal electrodes alternately disposed to overlap each other in first and second cover regions of the body disposed between a respective one of the first and second surfaces of the body and an active region including the first and second internal electrodes. The body further comprises pluralities of first and second via electrodes, a first via electrode and a second via electrode extending from the first surface to a respective one of the third and fourth internal electrodes in the first cover region, and another first via electrode and another second via electrode extending from the second surface to a respective one of the third and fourth internal electrodes in the second cover region.

Each of the third and fourth internal electrodes may be spaced apart from all outer surfaces of the body.

The active region of the body including the first and second internal electrodes may be free of the first and second via electrodes.

The first and second via electrodes in the first cover region may contact extensions of the first and second external electrodes, respectively, on the first surface of the body.

The multilayer capacitor may further include third and fourth external electrodes disposed on the first surface of the body and respectively contacting the first and second via electrodes of the first cover region.

The first, second, third, and fourth internal electrodes may be parallel to each other and to the mounting surface of the body.

The third and fourth internal electrodes may be spaced apart from the second and first via electrodes, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments will be described in detail with reference to the accompanying drawings.

Directions of a body of a capacitor will be defined in order to clearly describe exemplary embodiments in the present disclosure. X, Y and Z in the drawings refer to a length direction, a width direction, and a thickness direction, respectively. Here, the thickness direction may be the same as a stacking direction of dielectric layers and internal electrodes in the multilayer capacitors.

In addition, in the present exemplary embodiment, for convenience of explanation, first and second surfaces 1 and 2 of a capacitor body 110 refer to both surfaces of the capacitor body 110 opposing each other in an Z direction (e.g., a thicknes direction), third and fourth surfaces 3 and 4 of the capacitor body 110 refer to both surfaces of the capacitor body 110 opposing each other in an X direction (e.g., a length direction) and connecting edges of the first and second surfaces 1 and 2 to each other, and fifth and sixth surfaces 5 and 6 of the capacitor body 110 refer to both surfaces of the capacitor body 110 opposing each other in a Y direction (e.g., a width direction), connecting edges of the first and second surfaces 1 and 2 to each other, and connecting edges of the third and fourth surfaces 3 and 4 to each other. Here, the first surface 1 may be the same as a mounting surface.

Figure 1:
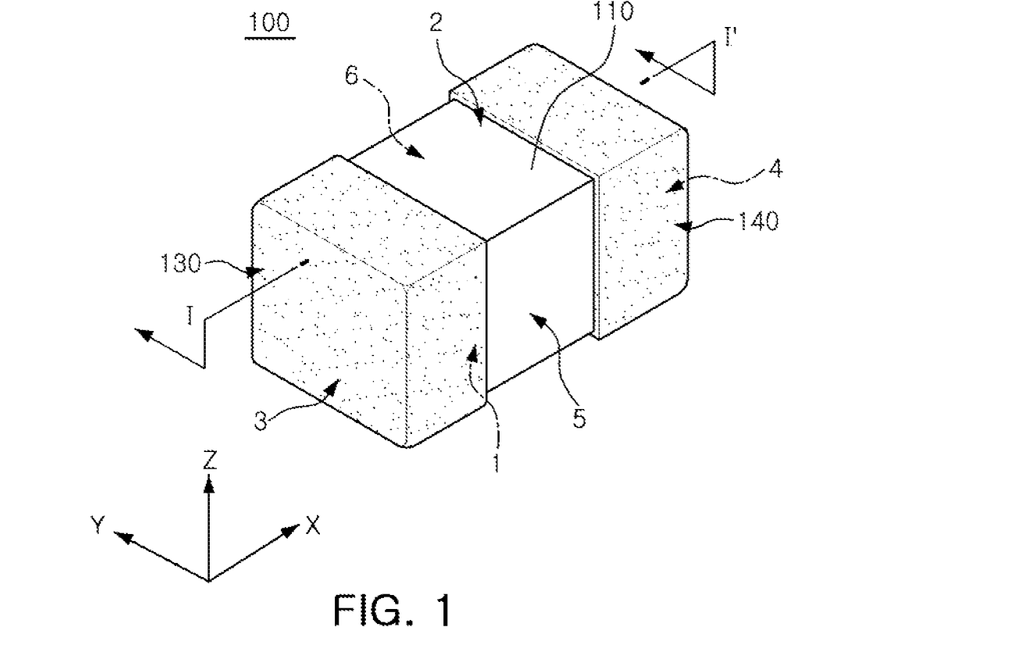
FIG. 1 is a schematic perspective view illustrating a multilayer capacitor according to an exemplary embodiment.
Figure 2:
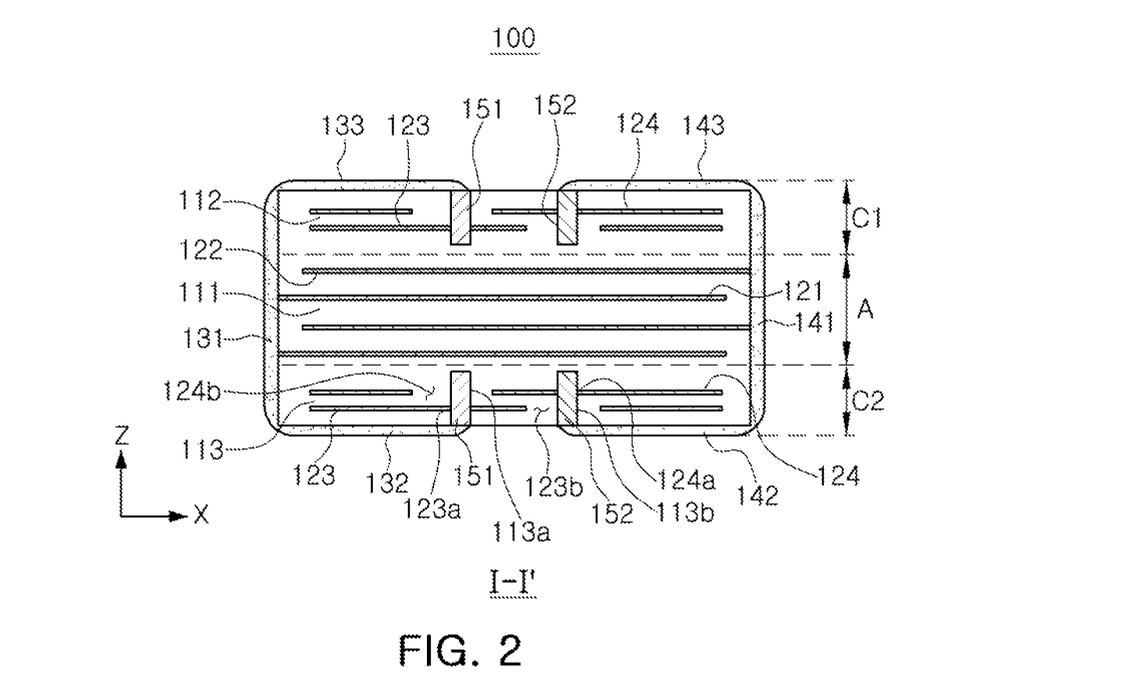
FIG. 2 is a cross-sectional view taken along line I-I' of FIG. 1.
Figure 3:
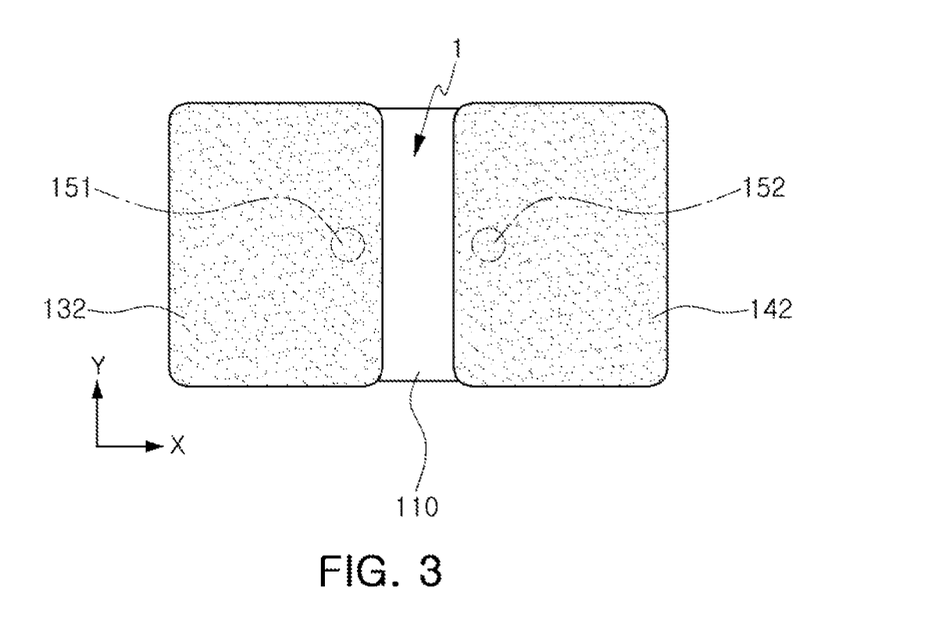
FIG. 3 is a bottom view of the multilayer capacitor shown in FIG. 1.

FIG. 1 is a schematic perspective view illustrating a multilayer capacitor according to an exemplary embodiment, FIG. 2 is a cross-sectional view taken along line I-I' of FIG. 1, and FIG. 3 is a bottom view of the multilayer capacitor of FIG. 1.

Referring to FIGS. 1 through 3, a multilayer capacitor 100 according to the present exemplary embodiment may include a capacitor body 110 including dielectric layers 111 and pluralities of first and second internal electrodes 121 and 122, third and fourth internal electrodes 123 and 124, first and second external electrodes 130 and 140, and first and second via electrodes 151 and 152.

The capacitor body 110 may be formed by stacking a plurality of dielectric layers 111 in the Z direction, and may have an approximately hexahedral shape as illustrated in the drawings, but is not particularly limited thereto.

In this case, a shape and a dimension of the capacitor body 110 and the number of stacked dielectric layers 111 are not limited to those illustrated in the drawings.

In addition, the dielectric layers 111 may be in a sintered state, and adjacent dielectric layers 111 may be integrated with each other so that boundaries therebetween are not readily apparent without using a scanning electron microscope (SEM).

The capacitor body 110 may include an active region A, which contributes to forming a capacitance of the multilayer capacitor, including the pluralities of first and second internal electrodes 121 and 122. The capacitor body 110 may further include first and second cover regions C2 and C1, which are margin portions disposed, respectively, on opposite surfaces of the active region A in the Z direction.

The active region A may be formed by alternately stacking the pluralities of first and second internal electrodes 121 and 122 in the Z direction with respective dielectric layers 111 interposed therebetween.

In this case, a thickness of the dielectric layer 111 may be arbitrarily changed depending on a capacitance design of the multilayer capacitor 100.

In addition, the dielectric layer 111 may include ceramic powder particles having a high dielectric constant, such as barium titanate ($BaTiO_3$) based powder particles or strontium titanate ($SrTiO_3$) based powder particles. However, a material of the dielectric layer 111 is not limited thereto.

In addition, the dielectric layer 111 may further include at least one of a ceramic additive, an organic solvent, a plasticizer, a binder, a dispersant, and the like, if necessary, in addition to the ceramic powder particles.

The first and second cover regions C2 and C1 may be disposed at both sides of the capacitor body 110 in the Z direction, respectively. The first and second cover regions C2 and C1 may be formed by stacking single dielectric layers 112 and 113 or two or more dielectric layers 112 and 113 on upper and lower surfaces of the active region A in the Z direction, respectively, and alternately stacking one or more third and fourth internal electrodes 123 and 124 with respective dielectric layers 112 and 113 interposed therebetween. The first and second cover regions C2 and C1 may serve to prevent damage to the first and second internal electrodes 121 and 122 due to physical or chemical stress.

In this case, a thickness of each of the dielectric layers 112 and 113 disposed in the first and second cover regions C2 and C1 may be equal to or greater than that of each of the dielectric layer 111 disposed in the active region A. Therefore, an equivalent series inductance (ESL) may be further decreased by disposing third and fourth internal electrodes 123 and 124 to be described below in the cover regions.

The first and second internal electrodes 121 and 122 may have different polarities.

In addition, in the present exemplary embodiment, the first and second internal electrodes 121 and 122 may mainly serve to implement a capacitance of the multilayer capacitor 100, and may be alternately disposed in the Z direction within the active region A of the capacitor body 110 with respective dielectric layers 111 interposed therebetween, and an area of the first and second internal electrodes 121 and 122 overlapping each other in the Z direction may be associated with formation of the capacitance of the multilayer capacitor 100.

One end of each of the first and second internal electrodes 121 and 122 may be exposed through the third and fourth surfaces 3 and 4 of the capacitor body 110, respectively.

In addition, the first and second internal electrodes 121 and 122 may be formed by printing a conductive paste including a conductive metal at a predetermined thickness on the dielectric layers 111, and may be electrically insulated from each other by each of the dielectric layers 111 disposed therebetween.

The conductive metal included in the conductive paste may be, for example, nickel (Ni), copper (Cu), palladium (Pd), or alloys thereof, but is not limited thereto.

In addition, a method of printing the conductive paste may be a screen printing method, a gravure printing method, or the like, but is not limited thereto.

The third and fourth internal electrodes 123 and 124 may have different polarities.

In addition, the third and fourth internal electrodes 123 and 124 may have a floating electrode form, and may be disposed to be spaced apart from edges of the capacitor body 110. That is, the third and fourth internal electrodes 123 and 124 may not be exposed to the outside of the capacitor body 110.

In the present exemplary embodiment, the third and fourth internal electrodes 123 and 124 may be spaced apart from each other in the Z direction within the first and second cover regions C2 and C1 of the capacitor body 110 with respective dielectric layers 112 and 113 disposed therebetween.

In this case, the third and fourth internal electrodes 123 and 124 may mainly serve to reduce an ESL of the multilayer capacitor 100 by shortening a current path rather than forming the capacitance of the multilayer capacitor 100.

In addition, the third and fourth internal electrodes 123 and 124 may be formed by printing a conductive pate including a conductive metal at a predetermined thickness on the dielectric layers 112 and 113, and may be electrically insulated from each other by each of the dielectric layers 112 and 113 disposed therebetween.

The conductive metal included in the conductive paste may be, for example, nickel (Ni), copper (Cu), palladium (Pd), or alloys thereof, but is not limited thereto.

In addition, a method of printing the conductive paste may be a screen printing method, a gravure printing method, or the like, but is not limited thereto.

In this case, the third and fourth internal electrodes 123 and 124 may be formed at thicknesses smaller than the thicknesses of the first and second internal electrodes 121 and 122.

Meanwhile, while a case in which only one third internal electrode 123 and one fourth internal electrode 124 are disposed in each of the first and second cover regions C2 and C1 is illustrated and described in the present exemplary embodiment, the third and fourth internal electrodes 123 and 124 are not limited thereto. That is, two or more third and fourth internal electrodes 123 and 124 may be alternately stacked in each of the first and second cover regions C2 and C1.

The first external electrode 130 may include a first connected portion 131 and a first band portion 132.

The first connected portion 131 may be formed on the third surface 3 of the capacitor body 110, and may be electrically connected to portions of the first internal electrodes 121 exposed through the third surface 3 of the capacitor body 110.

The first band portion 132 may extend from a lower end of the first connected portion 131 to a portion of the first surface 1 of the capacitor body 110.

In this case, a length of the first band portion 132 may be less than ½ of a length of the first surface 1 of the capacitor body 110.

The second external electrode 140 may include a second connected portion 141 and a second band portion 142.

The second connected portion 141 may be formed on the fourth surface 4 of the capacitor body 110, and may be electrically connected to portions of the second internal electrodes 122 exposed through the fourth surface 4 of the capacitor body 110.

The second band portion 142 may extend from a lower end of the second connected portion 141 to a portion of the first surface 1 of the capacitor body 110.

In this case, a length of the second band portion 142 may be less than ½ of the length of the first surface 1 of the capacitor body 110, such that the second band portion 142 remains spaced apart from the first band portion 132 on the first surface 1.

The first via electrode 151 may penetrate through the first cover region C2 of the capacitor body 110 to connect the third internal electrode 123 and the first band portion 132 of the first external electrode 130 to each other.

The second via electrode 152 may penetrate through the first cover region C2 of the capacitor body 110 to connect the fourth internal electrode 124 and the second band portion 142 of the second external electrode 140 to each other.

A cross section of each of the first and second via electrodes 151 and 152 cut in an X-Y direction may have one of a circular shape (e.g., as shown in dashed lines in FIG. 3), a rectangular shape, and a triangular shape, but is not limited thereto.

In addition, a thickness of each of the first and second via electrodes 151 and 152 may be 10% to 65% of a width of the capacitor body 110 in the Y direction, but is not limited thereto.

Meanwhile, a first band portion 133 may further extend from an upper end of the first connected portion 131 to a portion of the second surface 2 of the capacitor body 110, and a second band portion 143 may further extend from an upper end of the second connected portion 141 to a portion of the second surface 2 of the capacitor body 110.

In this case, the first and second via electrodes 151 and 152 may further be disposed in the first cover region C2 of the capacitor body 110 to have forms similar to those of the first and second via electrodes 151 and 152 disposed in the second cover region C1.

When via electrode structures are formed in both of the first and second cover regions C2 and C1, directivity of the multilayer capacitor in a vertical direction at the time of mounting the multilayer capacitor on a circuit board may be removed. In such situations, either of the first and second surfaces 1 and 2 can be used as a mounting surface of the capacitor.

Next, the via electrode structure of the cover region will be described. Since structures of the second cover region C1 and the first cover region C2 are substantially similar to each other, a description will hereinafter be provided in relation to the first cover region C2 disposed at a lower portion of the drawing, but it is considered that such a description can be applied to the second cover region C1.

According to the exemplary embodiment, in the first cover region C2, first and second via through-holes 113*a* and 113*b* may be formed in the dielectric layer 113 so that the first and second via electrodes 151 and 152 penetrate through the dielectric layer 113. In this case, the first and second via through-holes 113*a* and 113*b* may be formed to be spaced apart from each other in the X direction.

In addition, the third internal electrode 123 may include a first via hole 123*a* and a first via spacing hole 123*b*. The first via hole 123*a* may be formed to have a size corresponding to that of the first via through-hole 113*a* in a position corresponding to that of the first via through-hole 113*a*, and the first via spacing hole 123*b* may be formed to have a size greater than that of the second via through-hole 113*b* in a position corresponding to that of the second via through-hole 113*b*.

In addition, the fourth internal electrode 124 may include a second via hole 124*a* and a second via spacing hole 124*b*. The second via hole 124*a* may be formed to have a size corresponding to that of the second via through-hole 113*b* in a position corresponding to that of the second via through-hole 113*b*, and the second via spacing hole 124*b* may be formed to have a size greater than that of the first via through-hole 113*a* in a position corresponding to that of the first via through-hole 113*a*.

According to such a structure, the first via electrode 151 formed in the first via through-hole 113*a* may be connected to the first band portion 132 of the first external electrode 130 and to the third internal electrode 123 to electrically connect the first external electrode 130 and the third internal electrode 123 to each other. In this case, the first via electrode 151 may not be connected to the second external electrode 140 and the fourth internal electrode 124.

In addition, the second via electrode 152 formed in the second via through-hole 113*b* may be connected to the second band portion 142 of the second external electrode 140 and to the fourth internal electrode 124 to electrically connect the second external electrode 140 and the fourth internal electrode 124 to each other. In this case, the second via electrode 152 may not be connected to the first external electrode 130 and the third internal electrode 123.

Figure 4:
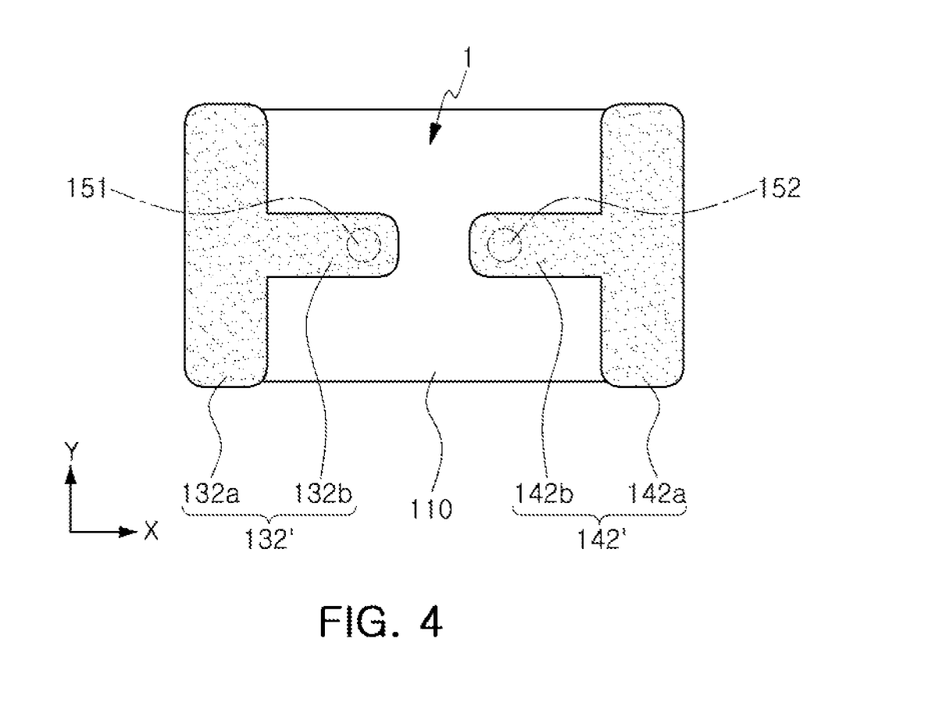
FIG. 4 is a bottom view illustrating a modified example of a band portion.

FIG. 4 is a bottom view illustrating a modified example of a band portions. Since structures of a band portion formed on the first surface 1 of the capacitor body 110 and a band portion formed on the second surface 2 of the capacitor body 110 are substantially similar to each other, a description will hereinafter be provided only in relation to the first surface 1, but it is considered that such a description can be applied to band portions formed on the second surface 2.

Referring to FIG. 4, in first and second external electrodes according to the present exemplary embodiment, first and second band portions 132' and 142' may include first body portions 132*a* and 142*a* and second body portions 132*b* and 142*b*, respectively.

The first and second body portions 132*a* and 142*a* may extend from the first and second connected portions 131 and 141 respectively formed on the third and fourth surfaces 3 and 4 of the capacitor body 110 toward the first surface 1 of the capacitor body 110 in the X direction, respectively.

The second body portions 132*b* and 142*b* may further extend from the first and second body portions 132*a* and 142*a* in the X direction, respectively, and may have margins formed at both sides thereof to have widths (measured in the Y direction) smaller than those of the first body portions 132*a* and 142*a*.

In this case, the first and second via electrodes 151 and 152 may be electrically connected to the second body portions 132*b* and 142*b*, respectively.

Figure 5:
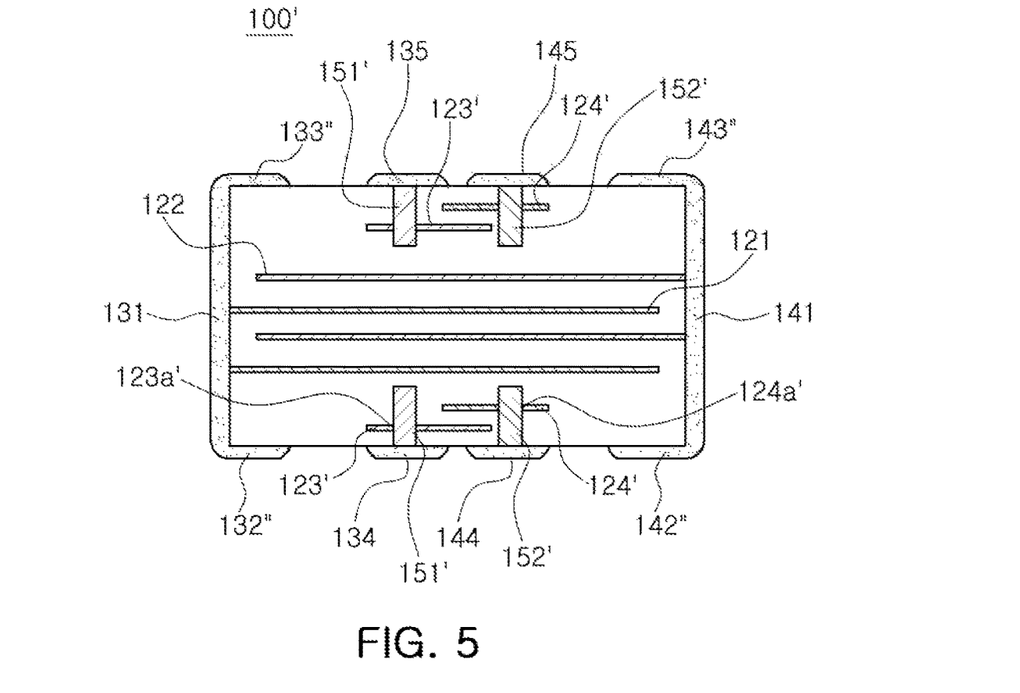
FIG. 5 is a schematic cross-sectional view illustrating a multilayer capacitor according to another exemplary embodiment.
Figure 6:
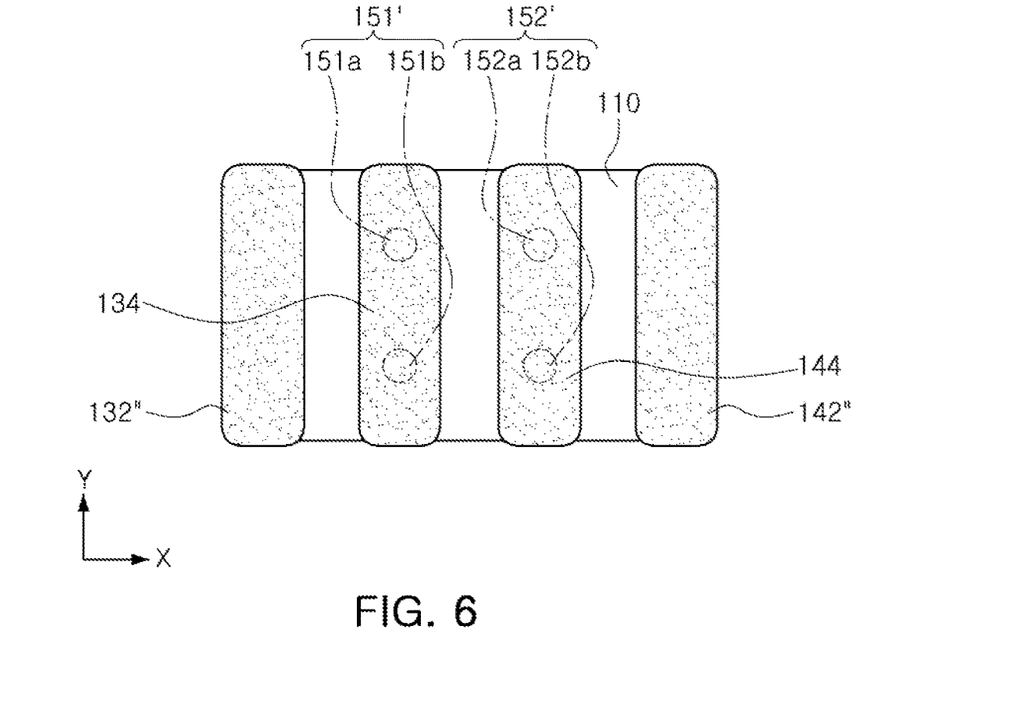
FIG. 6 is a bottom view of the multilayer capacitor shown in FIG. 5.

FIG. 5 is a schematic cross-sectional view illustrating a multilayer capacitor according to another exemplary embodiment, and FIG. 6 is a bottom view of FIG. 5.

Referring to FIGS. 5 and 6, a multilayer capacitor 100' according to the present exemplary embodiment may further include third external electrodes 134 and 135 and fourth external electrodes 144 and 145.

A case in which the third external electrodes 134 and 135 and the fourth external electrodes 144 and 145 are formed on both of the first and second surfaces land 2 of the capacitor body 110 is illustrated and described in the present exemplary embodiment, but the third and fourth external electrodes may be formed on only one of the first and second surfaces 1 and 2 of the capacitor body 110, if desired.

In addition, structures of an active region and first and second internal electrodes of the capacitor body are similar to those of the exemplary embodiment described above, and a detailed description thereof is thus omitted in order to avoid an overlapping description.

In the present exemplary embodiment, the third external electrodes 134 and 135 may be disposed on the first and second surfaces 1 and 2 of the capacitor body 110, respectively, to face each other, and may be disposed to be spaced apart from first band portions 132" and 133" of a first external electrode, respectively.

To this end, the first band portions 132" and 133" may be formed at lengths (measured in the X direction) smaller than those of the first band portions 132 and 133 of the exemplary embodiment described above.

In addition, end portions of first via electrodes 151' may be electrically connected to the third external electrodes 134 and 135.

The first via electrodes 151' may penetrate through cover regions of the capacitor body 110 to connect third internal electrodes 123' and the third external electrodes 134 and 135 to each other.

In this case, two or more first via electrodes 151' may be disposed in the cover region in order to improve electrical connectivity.

For example, as illustrated in FIG. 6, two first via electrodes may be disposed to be spaced apart from each other in the Y direction, and the respective first via electrodes 151*a* and 151*b* may be simultaneously connected to one third external electrode 134. Since structures of a second cover region disposed at an upper portion of the drawing and a first cover region disposed at a lower portion of the drawing are substantially similar to each other, a description will hereinafter be provided in relation to the first cover region, but it is considered that such a description can equally apply to the second cover region.

The third internal electrode 123' may include a via hole 123*a*' formed to have a size corresponding to that of the first via electrode 151' in a position corresponding to that of the first via electrode 151'. Meanwhile, the third internal electrode 123' may have a length smaller than that of the third internal electrode 123 in the exemplary embodiment described above. For example, the third internal electrode 123' may be formed at a length at which one end portion thereof is not in contact with a second via electrode 152'. In this case, the first via spacing hole 123b in the exemplary embodiment described above may not be formed in the third internal electrode 123'.

The fourth external electrodes 144 and 145 may be disposed on the first and second surface 1 and 2 of the capacitor body 110, respectively, to face each other, and may be disposed to be spaced apart from second band portions 142" and 143" of a second external electrode, respectively.

To this end, the second band portions 142" and 143" may be formed at lengths smaller than those of the first band portions 142 and 143 of the exemplary embodiment described above.

In addition, end portions of second via electrodes 152' may be electrically connected to the fourth external electrodes 144 and 145.

The second via electrodes 152' may penetrate through the first cover region of the capacitor body 110 to connect fourth internal electrodes 124' and the fourth external electrodes 144 and 145 to each other.

In this case, two or more second via electrodes 152' may be disposed in the first cover region in order to improve electrical connectivity, similar to the first via electrodes.

For example, as illustrated in FIG. 6, two second via electrodes 152' may be disposed to be spaced apart from each other in the Y direction, and the respective second via electrodes 152a and 152b may be simultaneously connected to one fourth external electrode 144.

Since structures of the second cover region and the first cover region are substantially similar to each other, a description will hereinafter be provided in relation to the first cover region in FIG. 6, but it is considered that such a description can be applied to the second cover region.

The fourth internal electrode 124' may include a via hole 124a' formed to have a size corresponding to that of the second via electrode 152' in a position corresponding to that of the second via electrode 152'. Meanwhile, the fourth internal electrode 124' may have a length smaller than that of the fourth internal electrode 124 in the exemplary embodiment described above. For example, the fourth internal electrode 124' may be formed at a length at which one end portion thereof is not in contact with a first via electrode 151'. In this case, the second via spacing hole 124b in the exemplary embodiment described above may not be formed in the fourth internal electrode 124'.

Figure 7:
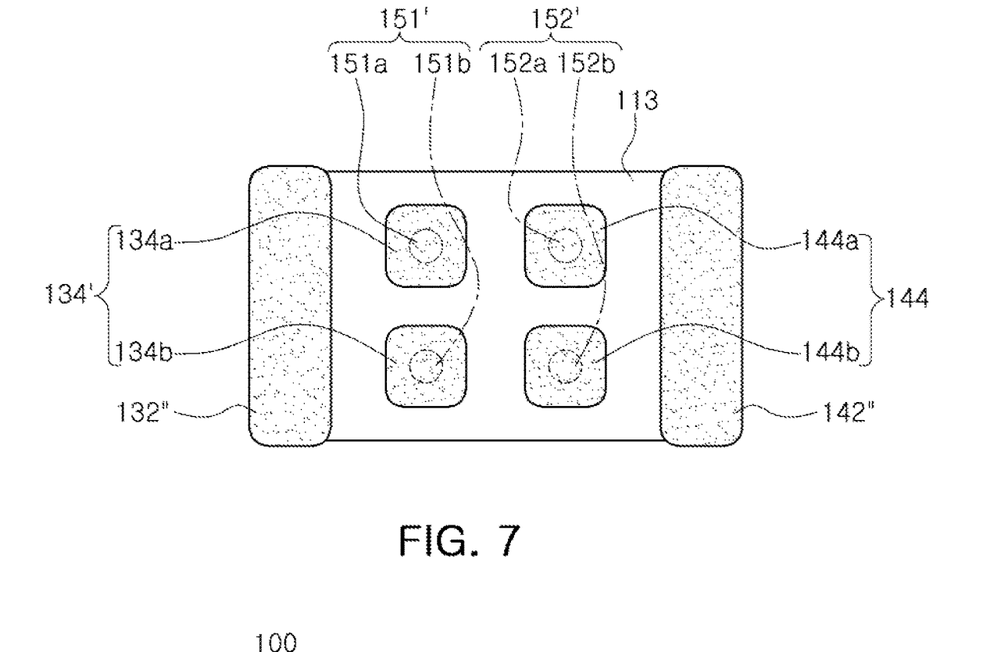
FIG. 7 is a bottom view illustrating an example in which numbers of via electrodes and third and fourth external electrodes are modified.

FIG. 7 is a bottom view illustrating an example in which the numbers of via electrodes and third and fourth external electrodes are modified.

Referring to FIG. 7, a first via electrode 151' according to the present exemplary embodiment may include a plurality of unit electrodes 151a and 151b, and a second via electrode 152' according to the present exemplary embodiment may include a plurality of unit electrodes 152a and 152b.

A case in which each of the first and second via electrodes 151' and 152' includes two unit electrodes is illustrated and described in the present exemplary embodiment, but each of the first and second via electrodes 151' and 152' is not limited thereto. That is, each of the first and second via electrodes may also include one or three or more unit electrodes.

In addition, a third external electrode 134' may include unit electrodes 134a and 134b of which the number corresponds to that of unit electrodes of the first via electrode 151', and a fourth external electrode 144' may include unit electrodes 144a and 144b of which the number corresponds to that of unit electrodes of the second via electrode 152'.

A case in which each of the first and second external electrodes 134' and 144' includes two unit electrodes is illustrated and described in the present exemplary embodiment, but each of the first and second external electrodes 134' and 144' is not limited thereto. That is, each of the first and second external electrodes may also include one or three or more unit electrodes depending on the numbers of unit electrodes of the via electrodes.

Meanwhile, in a multilayer capacitor according to the related art using via electrodes, the via electrodes may be formed by forming via holes in a stacked direction of internal electrodes in a capacitor body using a laser drill to penetrate through the capacitor body and then filling the via holes by plating.

However, when dielectric layers are formed at a small thickness, it may not be easy to form the via holes at a uniform thickness and a predetermined depth. For example, a short-circuit may occur depending on a depth of the via holes. In addition, when via electrode patterns are formed on the internal electrodes in order to solve this problem, a capacitance may be decreased.

In addition, when the via holes are formed using the laser drill to penetrate through the capacitor body, misalignment between the internal electrodes in this process may occur.

In addition, when the plating is performed in order to form the via electrodes after the via holes are formed, a process of forming a sheet for the plating may be required, and it may thus be difficult to control a metal for a seed to be implemented in the via holes.

In addition, when the via electrodes are formed by the plating, connectivity between the via electrodes and the internal electrodes may be decreased.

In the via electrodes according to the present exemplary embodiment, a plating process may not be used. In the via electrodes according to the present exemplary embodiment, via holes may be formed in the cover regions by a mechanical punch process before a heat treatment process is performed. In this case, the via holes may be connected to third and fourth internal electrodes disposed in the cover regions.

In addition, low ESL and high reliability of the multilayer capacitor may be secured by filling a material that may be co-fired with a laminate, such as a nickel (Ni) paste, in the via holes by a method such as a screen printing method, cutting the laminate at a single chip size, simultaneously performing heat treatment on single chips cut at the single chip size by a plasticizing or firing process, and the forming first and second external electrodes on the capacitor body.

In addition, in the present exemplary embodiment, the via holes are not formed in the active region, and are formed in only the cover regions, such that a process of increasing a thickness of the dielectric layers disposed in the active region or compressing an active layer before forming the via holes does not need to be performed.

In addition, misalignment between the internal electrodes disposed in the active region does not occur, which is advantageous in securing a capacitance.

Figure 8:
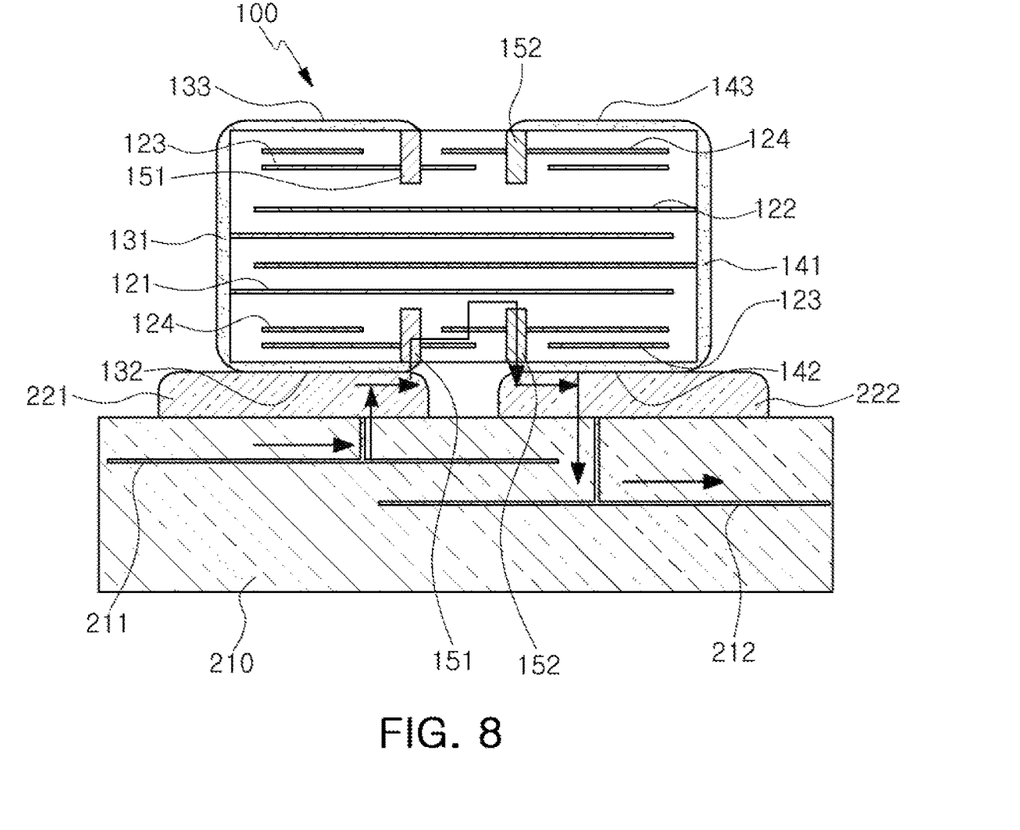
FIG. 8 is a cross-sectional view illustrating a state in which the multilayer capacitor of FIG. 2 is mounted on a circuit board.

Referring to FIG. 8, a board having a multilayer capacitor according to the present exemplary embodiment may include a circuit board 210 on which the multilayer capacitor 100 is mounted and first and second electrode pads 221 and 222 formed on an upper surface of the circuit board 210 to be spaced apart from each other in the X direction.

The multilayer capacitor 100 may be fixed and electrically connected to the circuit board 210 by solders (not illustrated) in a state in which the first and second band portions 132 and 142 of the first and second external electrodes 130 and 140 are disposed on the first and second electrode pads 221 and 222, respectively, to be in contact with the first and second electrode pads 221 and 222, respectively.

Reference numerals 211 and 212 that are not described indicate circuits in the circuit board 210. According to the present exemplary embodiment, the first and second via electrodes 151 and 152 and the third and fourth internal electrodes 123 and 124 may be disposed in the first cover region C2 adjacent to a mounting surface 1 to decrease a length of a current path from the first external electrode to the second external electrode, resulting in a decrease in an ESL as illustrated by arrows.

Figure 9:
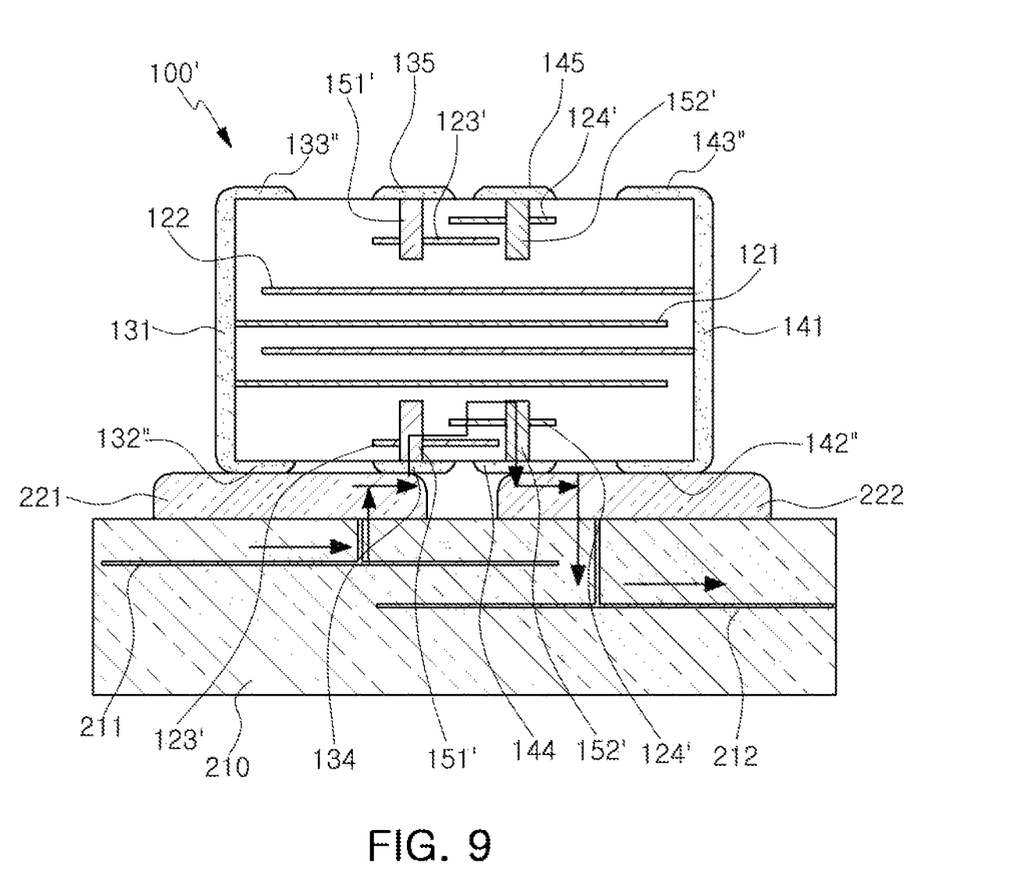
FIG. 9 is a cross-sectional view illustrating a state in which the multilayer capacitor of FIG. 5 is mounted on a circuit board.

Referring to FIG. 9, a board having a multilayer capacitor according to the present exemplary embodiment may include a circuit board 210 on which the multilayer capacitor 100' is mounted and first and second electrode pads 221 and 222 formed on an upper surface of the circuit board 210 to be spaced apart from each other in the X direction.

The multilayer capacitor 100' may be fixed and electrically connected to the circuit board 210 by solders (not illustrated) in a state in which the first band portion 132" of the first external electrode 130 and the third external electrode 134 are disposed on the first electrode pad 221 to be in contact with the first electrode pad 221. Additionally, the second band portion 142" of the second external electrode 140 and the fourth external electrode 144 are disposed on the second electrode pad 222 to be in contact with the second electrode pad 222.

As set forth above, according to the exemplary embodiments, miniaturization of the multilayer capacitor may be implemented, a high capacitance of the multilayer capacitor may be secured, and a low ESL of the multilayer capacitor may be implemented.

While exemplary embodiments have been shown and described above, it will be apparent to those skilled in the art that modifications and variations could be made without departing from the scope of the present invention as defined by the appended claims.

What is claimed is:

1. A multilayer capacitor:
a capacitor body having first and second surfaces opposing each other and third and fourth surfaces connected to the first and second surfaces and opposing each other, and including an active region including dielectric layers and pluralities of first and second internal electrodes alternately disposed with respective dielectric layers interposed therebetween and first and second cover regions disposed on opposite surfaces of the active region, the first and second internal electrodes being exposed through the third and fourth surfaces, respectively;
third and fourth internal electrodes alternately disposed in the first cover region adjacent to the first surface with respective dielectric layers interposed therebetween;
first and second external electrodes including first and second connected portions respectively formed on the third and fourth surfaces of the capacitor body and respectively connected to the first and second internal electrodes, and first and second band portions respectively extending from the first and second connected portions to portions of the first surface of the capacitor body;
a first via electrode penetrating through the first cover region to connect the third internal electrode and the first band portion to each other; and
a second via electrode penetrating through the first cover region to connect the fourth internal electrode and the second band portion to each other,
wherein the first surface is a mounting surface,
the third internal electrode contacts only the first via electrode, from among the first and second via electrodes and first and second external electrodes, and
the fourth internal electrode contacts only the second via electrode, from among the first and second via electrodes and first and second external electrodes.

2. The multilayer capacitor of claim 1, wherein the multilayer capacitor includes pluralities of third and fourth internal electrodes including third and fourth internal electrodes alternately disposed in the second cover region adjacent to the second surface with respective dielectric layers interposed therebetween,
the first and second band portions further extend from the first and second connected portions to portions of the second surface of the capacitor body, and
the multilayer capacitor includes pluralities of first and second via electrodes including first and second via electrodes disposed in the second cover region.

3. The multilayer capacitor of claim 1, wherein the third and fourth internal electrodes are disposed to be spaced apart from all edges of the capacitor body.

4. The multilayer capacitor of claim 1, wherein the dielectric layer of the first cover region has first and second via through-holes formed therein with the first and second via electrodes penetrating therethrough,
the third internal electrode includes a first via hole formed to have a size corresponding to that of the first via through-hole in a position corresponding to that of the first via through-hole and a first via spacing hole formed to have a size greater than that of the second via through-hole in a position corresponding to that of the second via through-hole, and
the fourth internal electrode includes a second via hole formed to have a size corresponding to that of the second via through-hole in a position corresponding to that of the second via through-hole and a second via spacing hole formed to have a size greater than that of the first via through-hole in a position corresponding to that of the first via through-hole.

5. A multilayer capacitor comprising:
a capacitor body having first and second surfaces opposing each other and third and fourth surfaces connected to the first and second surfaces and opposing each other, and including an active region including dielectric layers and pluralities of first and second internal electrodes alternately disposed with respective dielectric layers interposed therebetween and first and second cover regions disposed on opposite surfaces of the active region, the first and second internal electrodes being exposed through the third and fourth surfaces, respectively;
third and fourth internal electrodes alternately disposed in the first cover region adjacent to the first surface with respective dielectric layers interposed therebetween;
first and second external electrodes including first and second connected portions respectively formed on the third and fourth surfaces of the capacitor body and respectively connected to the first and second internal electrodes, and first and second band portions respectively extending from the first and second connected portions to portions of the first surface of the capacitor body;

a first via electrode penetrating through the first cover region to connect the third internal electrode and the first band portion to each other; and a second via electrode penetrating through the first cover region to connect the fourth internal electrode and the second band portion to each other, wherein the first surface is a mounting surface, and the third and fourth internal electrodes have thicknesses smaller than thicknesses of the first and second internal electrodes.

6. The multilayer capacitor of claim 1, wherein each of the dielectric layers disposed in the first and second cover regions has a thickness equal to or greater than that of each of the dielectric layers disposed in the active region.

7. A board having a multilayer capacitor, comprising:

a circuit board having first and second electrode pads disposed thereon to be spaced apart from each other; and the multilayer capacitor of claim 1 mounted on the circuit board so that the first and second band portions are connected to the first and second electrode pads, respectively.

8. A multilayer capacitor comprising:

a body comprising pluralities of dielectric layers and internal electrodes alternately disposed therein; and first and second external electrodes disposed on respective opposing third and fourth end surfaces of the body and each extending to first and second surfaces of the body, wherein the plurality of internal electrodes includes:

first and second internal electrodes alternately disposed to overlap each other in the body and respectively extending to the third and fourth end surfaces of the body; and pluralities of third and fourth internal electrodes alternately disposed to overlap each other in first and second cover regions of the body disposed between a respective one of the first and second surfaces of the body and an active region including the first and second internal electrodes, and the body further comprises pluralities of first and second via electrodes, a first via electrode and a second via electrode extending from the first surface to a respective one of the third and fourth internal electrodes in the first cover region, and another first via electrode and another second via electrode extending from the second surface to a respective one of the third and fourth internal electrodes in the second cover region, wherein each third internal electrode is spaced apart from the first external electrode, on the third end surface, to which the third internal electrode is electrically connected, and each fourth internal electrode is spaced apart from the second external electrode, on the fourth end surface, to which the fourth internal electrode is electrically connected.

9. The multilayer capacitor of claim 8, wherein each of the third and fourth internal electrodes is spaced apart from all outer surfaces of the body.

10. The multilayer capacitor of claim 8, wherein the active region of the body including the first and second internal electrodes is free of the first and second via electrodes.

11. The multilayer capacitor of claim 8, wherein the first and second via electrodes in the first cover region contact extensions of the first and second external electrodes, respectively, on the first surface of the body.

12. The multilayer capacitor of claim 8, further comprising:

third and fourth external electrodes disposed on the first surface of the body and respectively contacting the first and second via electrodes of the first cover region.

13. The multilayer capacitor of claim 8, wherein the first, second, third, and fourth internal electrodes are parallel to each other and to the mounting surface of the body.

14. The multilayer capacitor of claim 8, wherein the third and fourth internal electrodes are spaced apart from the second and first via electrodes, respectively.

15. The multilayer capacitor of claim 8, wherein each third internal electrode contacts only a first via electrode, from among the first and second via electrodes and the first and second external electrodes, and each fourth internal electrode contacts only a second via electrode, from among the first and second via electrodes and the first and second external electrodes.

16. A board having a multilayer capacitor, comprising:

a circuit board having first and second electrode pads disposed thereon to be spaced apart from each other; and the multilayer capacitor of claim 8 mounted on the circuit board so that the first and second band portions are connected to the first and second electrode pads, respectively.

17. The multilayer capacitor of claim 1, wherein the third internal electrode is spaced apart from the first external electrode, on the third surface, to which the third internal electrode is electrically connected, and the fourth internal electrode is spaced apart from the second external electrode, on the fourth surface, to which the fourth internal electrode is electrically connected.

* * * * *